United States Patent [19]
Ichishima et al.

[11] Patent Number: 5,324,411
[45] Date of Patent: Jun. 28, 1994

[54] ELECTRODE PLATE FOR PLASMA ETCHING

[75] Inventors: Masahiko Ichishima; Yasumi Sasaki; Eiichi Toya; Masatoshi Kasahara; Ritsurou Makita, all of Tokyo, Japan

[73] Assignee: Toshiba Ceramics Co., Ltd., Tokyo, Japan

[21] Appl. No.: 946,602

[22] Filed: Sep. 18, 1992

[30] Foreign Application Priority Data

Sep. 20, 1991 [JP] Japan .................................. 3-268857

[51] Int. Cl.$^5$ .............................................. H05H 1/46
[52] U.S. Cl. ........................ 204/298.33; 204/298.31; 156/345
[58] Field of Search ...................... 204/298.31, 298.33; 156/345, 643

[56] References Cited

U.S. PATENT DOCUMENTS

| | | | |
|---|---|---|---|
| 4,209,357 | 6/1980 | Gorin et al. | 156/643 |
| 4,297,162 | 10/1981 | Mundt et al. | 156/643 |
| 4,590,042 | 5/1986 | Drage | 422/186.06 |
| 4,612,077 | 9/1986 | Tracy et al. | 156/345 |
| 4,612,432 | 9/1986 | Sharp-Geisler | 219/121.43 |
| 4,780,169 | 10/1988 | Stark et al. | 156/345 |
| 4,792,378 | 12/1988 | Rose et al. | 156/643 |
| 5,006,220 | 4/1991 | Hijikata et al. | 204/298.33 |

FOREIGN PATENT DOCUMENTS

| | | | |
|---|---|---|---|
| 60-77427 | 5/1985 | Japan | 156/345 R |
| 61-67922 | 4/1986 | Japan | 156/345 |
| 61-104625 | 5/1986 | Japan | 204/298.33 |
| 62-98728 | 5/1987 | Japan | 156/345 R |
| 62-252942 | 11/1987 | Japan | 204/298.31 |
| 62-281426 | 12/1987 | Japan | 156/345 R |
| 2-198138 | 8/1990 | Japan | 204/298.33 |
| 4-242923 | 8/1992 | Japan | 156/643 |

*Primary Examiner*—Aaron Weisstuch
*Attorney, Agent, or Firm*—Finnegan, Henderson, Farabow, Garrett & Dunner

[57] ABSTRACT

A disc-shaped electrode plate body is made of high-purity glassy carbon and has a large number of very-small-diameter through holes each of which has a plurality of spherical recesses in its internal wall surface.

6 Claims, 1 Drawing Sheet

ELECTRODE PLATE FOR PLASMA ETCHING

BACKGROUND OF THE INVENTION

The present invention relates to an electrode plate used in a plasma etching process of semiconductor wafers. More specifically, the invention relates to an electrode plate used in the parallel-plate-type plasma gas etching apparatus, in which a large number of very-small-diameter through holes for enabling transmission of a reaction gas are formed in a disc-shaped electrode plate body.

In the parallel-plate-type plasma gas etching process, an upper electrode plate in which a large number of very-small-diameter through holes for enabling transmission of a reaction gas are formed in a disc-shaped electrode plate body is opposed to a disc-shaped lower electrode plate on which semiconductor wafers are placed. The reaction gas is dissociated by application of a high-frequency power across the two electrode plates, and resultant radicals and ions are vertically made incident on the semiconductor wafers to etch the portions not covered with a photoresist pattern.

Conventionally, an upper electrode plate of the above kind that is made of high-purity glassy carbon is known as a replacement of an electrode plate made of high-density graphite (Japanese Patent Application Unexamined Publication No. Sho. 62-252942].

This electrode plate for plasma etching made of high-purity glassy carbon is produced in the following manner. First, a liquid thermosetting furan resin or phenol resin, a mixed resin thereof, or one of these liquid resins mixed with a powder of the same thermosetting resin is shaped and set into a disc-shaped resin plate having a uniform thickness distribution. Then, the resin plate is fired and carbonized in an inert atmosphere at about 800° C. After being graphitized, when necessary, at a temperature not more than 3,000° C., the resin plate is purified in a deashing furnace. Very-small-diameter through holes are formed in the glassy carbon plate, which is produced by the firing and carbonizing process, by drilling it by, for instance, electric discharge machining. Alternatively, they are formed by drilling during the process of producing the shaped resin plate.

In the above electrode plate for plasma etching, the internal wall surface of the through holes has no pores, i.e., it is a smooth surface. However, it has been found that at the initial stage of the high-frequency power application across the upper and lower electrode plates, plasma hardly develops in a stable manner and, therefore, the charge density varies on the electrode surface. This will cause an etching rate variation on the semiconductor wafer surface, that is, the semiconductor wafer cannot be etched uniformly. Several times of blank discharging is required to obtain stable plasma. As a result, non-uniformly etched wafers are increased, and the life of the electrode plates is shortened.

SUMMARY OF THE INVENTION

An object of the present invention is to provide a long-life electrode plate for plasma etching which enables uniform etching and can prevent an etching rate variation.

According to the invention, an electrode plate for plasma etching comprises:

an electrode plate body made of high-purity glassy carbon and having a large number of very-small-diameter through holes, each of the through holes having a plurality of substantially spherical recesses in its internal wall surface.

DESCRIPTION OF THE PREFERRED EMBODIMENT

Figure 1:
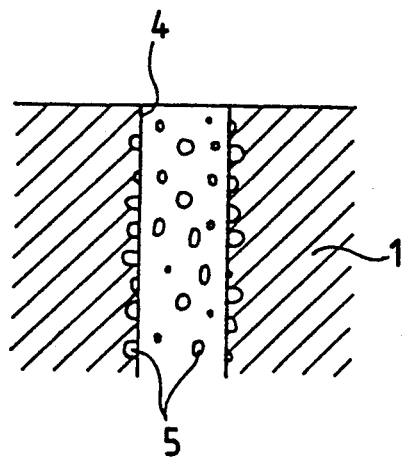
FIG. 1 is an enlarged sectional view of a very-small-diameter through hole formed in an electrode plate for plasma etching according to an embodiment of the present invention.
Figure 4:
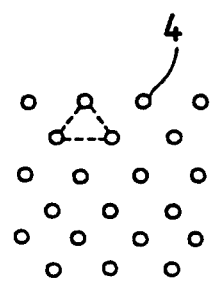
FIG. 4 is a plan view showing an arrangement of the very-small-diameter through holes.
Figure 2:
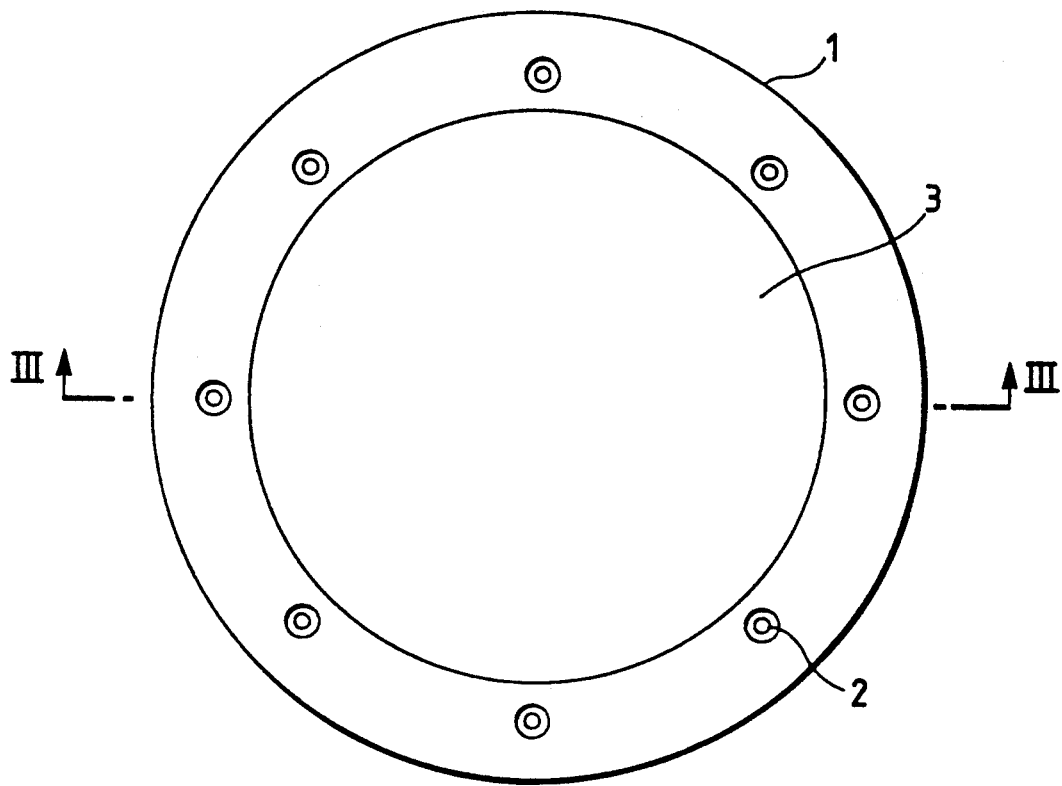
FIG. 2 is a schematic plan view of the whole electrode plate of FIG. 1.
Figure 3:
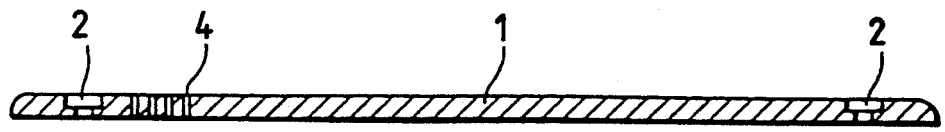
FIG. 3 is a sectional view taken along line III—III in FIG. 2.

An electrode plate for plasma etching according to an embodiment of the present invention is described hereinafter with reference to FIGS. 1-4.

In the figures, reference numeral 1 represents a disc-shaped electrode plate body made of high-purity (not more than 5 ppm impurity concentration) glassy carbon and having an outer diameter and a thickness of, for instance, 10 inch and 3 mm, respectively. A plurality of (eight in FIG. 2) spot facing bores 2 for attachment to a plasma etching apparatus are formed in a peripheral portion of the electrode plate body 1 at the same intervals in the circumferential direction.

In a circular central portion 3 of the electrode plate body 1, i.e., a portion other than its peripheral portion, a large number of very-small-diameter (e.g., 0.5-1.0 mm) through holes 4 are formed densely (about 9-10 holes/cm$^2$). To uniformly transmit a reaction gas to the plasma space to thereby etch semiconductor wafers uniformly, the through holes 4 are arranged such that any adjacent three through holes 4 are located at the vertices of a right triangle.

A plurality of spherical recesses 5 having a diameter of 10-100 μm are formed in the internal wall surface of each through hole 4 at a density of 100-400 recesses/cm$^2$. The recesses 5 are formed when a large number of independent closed pores that exist in the electrode plate body 1 in the state of a resin plate are exposed by the formation of the through hole 4. The independent closed pores disappear through the firing and carbonizing of the resin plate.

The electrode plate for plasma etching having the above structure is produced in the following manner. First, a polymerization process is repeated at the room temperature in which a small quantity of organic sulfonic acid is added, in succession, to a liquid thermosetting resin, such as a furan resin or a phenol resin. The resultant polymerized liquid is agitated by a mixer so that air bubbles are forcibly introduced into the polymerized liquid, and poured into a mold. Then, the temperature of the polymerized liquid is increased to 200° C. at the rate of 10° C./h, and retained at 200° C. for 24 hours, to obtain a disc-shaped resin plate having a diameter of 300 mm and a thickness of 10 mm and containing a large number of independent closed air bubbles.

Thereafter, taking into account a reduction of dimensions by the later firing process (described later), a plurality of spot facing bores are formed in the peripheral portion of the disc-shaped resin plate. Further, a large number of very-small-diameter through holes are formed in the central portion of the plate. The closed pores contained in the disc-shaped resin plate are opened by this formation of the through holes, so that a plurality of spherical recesses are formed in the internal wall surface of the through holes.

The temperature of the resin plate thus processed is increased to 280° C. at the rate of 2° C./h in a non-oxidizing atmosphere. Then, the atmosphere is changed to a gas atmosphere of $N_2+O_2$ or $Ar+O_2$, and the resin plate is retained at 280° C. for 50 hours. Then, the temperature of the resin plate is increased to 1,000° C. at the rate of 5° C./h in a non-oxidizing atmosphere, and the resin plate is fired and carbonized while being retained at 1,000° C. for 10 hours, to assume a glassy, three-dimensional network structure. Finally, the plate having this structure is purified in a halogen gas atmosphere at 2,300° C., to obtain a desired electrode plate for plasma etching.

The reason for retaining the resin plate in the gas atmosphere of $N_2+O_2$ or $Ar+O_2$ at 280° C. for 50 hours in the firing process is to modify (give a stability to oxidation) the internal wall surface that includes the recesses which were formed when the closed pores in the resin plate were cut in the process of forming the through holes, to thereby prevent the recesses from disappearing due to their contraction during the firing process. Since the internal wall surface is not modified in an inert atmosphere, the recesses will disappear or be reduced to deviate from a desired range by their contraction by firing (about 20%), so that a desired electrode plate for plasma etching cannot be produced.

This modification process may be performed at a temperature within the range of 60°-300° C. By forcibly adding oxygen at this temperature, a chemical reaction is caused to modify only the internal wall surfaces of the through holes and the surfaces of the resin plate. Therefore, the internal wall surfaces of the through holes are left as they are while the independent closed pores in the electrode plate disappear or shrink to an extremely small size due to their contraction during the firing process. In the above temperature range, the quality of carbon materials is modified with substantially no carbon consumption by oxidation.

Using, as the upper electrode plate, an electrode plate prepared according to the above method, silicon wafers were actually plasma-etched. In this experiment, the variation of the etching rate was reduced from the case of the conventional electrode plate made of glassy carbon. Further, the contamination of silicon wafers was reduced very much, and the life of the electrode plates was elongated.

It is preferred that the recesses 5 have diameters within the range of 10 to 100 $\mu$m, and be formed at a density of 100–400 recesses/cm$^2$. If the diameter is smaller than 10 $\mu$m, the surface area is so large that the recesses are likely to absorb impurity gases and particles. The impurity gases and particles released during the etching process will contaminate semiconductor wafers. On the other hand, if the diameter exceeds 100 $\mu$m, not only an adverse influence occurs in the reaction gas flow, but the advantages of the charge density increase (described below) will be lessened.

If the density is lower than 100 recesses/cm$^2$, the advantages of the charge density increase will also be lessened. On the other hand, if the density exceeds 400 recesses/cm$^2$, the absorption of impurity gases and particles becomes conspicuous.

As described in the foregoing, according to the electrode plate for plasma etching of the invention in which the recesses are formed in the internal wall surface of the through holes, the charge concentration can be established easily. In particular, stable plasma can develop easily at the initial stage of the high-frequency power application across the upper and lower electrode plates, and the charge density is increased. Further, since the charge area on the electrode plate becomes wider, stable plasma can be maintained for a longer period and unevenness of the generated plasma in the same plane can be reduced, which enables uniform etching, prevents an etching rate variation, and provides long-life electrode plates.

What is claimed is:
1. An electrode plate for plasma etching, comprising:
   an electrode plate body made of high-purity glassy carbon and having a plurality of very-small-diameter through holes, each of the through holes having a diameter of approximately 0.5–1.0 mm and a plurality of substantially spherical recesses in its internal wall surface.
2. The electrode plate of claim 1, wherein the diameter of the plurality of recesses is within a range of 10–100 $\mu$m.
3. The electrode plate of claim 1, wherein the density of the plurality of recesses is within a range of 100–400 recesses/cm$^2$.
4. An electrode plate for plasma etching, comprising:
   an electrode plate body made of high-purity glassy carbon and having a plurality of through holes, each of the through holes having a plurality of substantially spherical recesses in its internal wall surface.
5. The electrode plate of claim 4, wherein the diameter of the plurality of recesses is within a range of 10–100 $\mu$m.
6. The electrode plate of claim 4, wherein the density of the plurality of recesses is within a range of 100–400 recesses/cm$^2$.

* * * * *